United States Patent
Kasahara

(10) Patent No.: US 11,224,973 B2
(45) Date of Patent: Jan. 18, 2022

(54) MULTI-LEVEL HAND APPARATUS AND CONVEYING ROBOT PROVIDED WITH THE SAME

(71) Applicant: DAIHEN Corporation, Osaka (JP)

(72) Inventor: Kimihiro Kasahara, Osaka (JP)

(73) Assignee: DAIHEN Corporation, Osaka (JP)

( * ) Notice: Subject to any disclaimer, the term of this patent is extended or adjusted under 35 U.S.C. 154(b) by 127 days.

(21) Appl. No.: 16/717,257

(22) Filed: Dec. 17, 2019

(65) Prior Publication Data
US 2020/0198156 A1 Jun. 25, 2020

(30) Foreign Application Priority Data
Dec. 21, 2018 (JP) .............................. JP2018-239743

(51) Int. Cl.
*B25J 15/00* (2006.01)
*B65G 47/90* (2006.01)

(52) U.S. Cl.
CPC .......... *B25J 15/0052* (2013.01); *B65G 47/90* (2013.01)

(58) Field of Classification Search
CPC ... B65G 47/90; B25J 15/0052; B25J 15/0019; B25J 15/00; B25J 15/0014
See application file for complete search history.

(56) References Cited

U.S. PATENT DOCUMENTS

| 9,067,733 | B2 * | 6/2015 | Kitayama | ......... H01L 21/67781 |
| 2004/0013503 | A1 * | 1/2004 | Sandhu | ............. H01L 21/67781 414/416.08 |
| 2015/0016935 | A1 | 1/2015 | Hashimoto et al. | |

FOREIGN PATENT DOCUMENTS

JP 2013-135099 A 7/2013

* cited by examiner

*Primary Examiner* — Lynn E Schwenning
(74) *Attorney, Agent, or Firm* — Hamre, Schumann, Mueller & Larson, P.C.

(57) ABSTRACT

A multi-level hand apparatus includes a plurality of hands arranged to overlap with each other as viewed in a vertical direction, and each hand includes a hand body and a support body that supports the hand body at a base portion of the hand body. The multi-level hand apparatus further includes a guide for allowing and guiding movement of the hands in the vertical direction while maintaining the orientations of the hands, and a hand pitch limiter for defining a maximum pitch of the hands. The hands are divided into two groups, i.e., the first-group hands located at every other position and the second-group hands other than the first-group hands. The hand pitch limiter defines the maximum pitch between pairs of a first-group hand and a second-group hand that are vertically adjacent to each other.

7 Claims, 13 Drawing Sheets

MULTI-LEVEL HAND APPARATUS AND CONVEYING ROBOT PROVIDED WITH THE SAME

FIELD

The present disclosure relates to a multi-level hand apparatus capable of conveying plate-shaped workpieces collectively, and also relates to a conveying robot provided with the multi-level hand apparatus.

BACKGROUND

A multi-level hand apparatus that can convey multiple plate-shaped workpieces such as semiconductor wafers at the same time is disclosed in JP-A-2013-135099, for example. This conventional multi-level hand apparatus is configured such that the hand pitch can be changed so as to be able to convey groups of workpieces between cassettes having different pitches.

The mechanism for changing the hand pitch described in JP-A-2013-135099 has a configuration in which support bases that each support a hand are overlaid in the vertical direction, the support bases are guided so as to be capable of sliding in the vertical direction while maintaining a horizontal orientation, elongated holes that extend in the horizontal direction are provided in appropriate portions of the support bases, an elongated pivot member that pivots about a lower portion thereof is provided with pins arranged at a predetermined interval, and the pins are engaged with the elongated holes of the support bases. According to this configuration, the vertical pitch of the support bases can be changed by pivoting the elongated pivot member between an inclined orientation and a vertical orientation, for example.

With the configuration described above, in order to make it possible to increase the number of support bases and change the pitch between them, it is necessary to extend the length of the elongated pivot member. However, this entails changing the lengthwise sizes of the elongated holes of the support bases, which incurs an unnecessary increase in the amount of planar space occupied by the mechanism and the weight thereof.

SUMMARY

In light of the above circumstances, the present disclosure aims to provide a multi-level hand apparatus that has a variable hand pitch and does not require an increase in the amount of occupied space even if the number of supportable workpieces is increased. The present disclosure also aims to provide a conveying robot incorporating such a multi-level hand apparatus.

According to a first aspect of the present disclosure, there is provided a multi-level hand apparatus including: a plurality of hands arranged to overlap with each other as viewed in a vertical direction and each having a hand body and a support body that supports the hand body at a base portion of the hand body; a guide for allowing and guiding movement of the hands in the vertical direction while maintaining orientations of the hands; and a hand pitch limiter for defining a maximum pitch of the hands. The hands include first-group hands located at every other position and second-group hands other than the first-group hands. The hand pitch limiter defines the maximum pitch between pairs of a first-group hand and a second-group hand that are vertically adjacent to each other.

Preferably, the maximum pitch between a first-group hand located on an upper side and a second-group hand located immediately therebelow is defined by abutment between an upward abut portion provided on the first-group hand and a downward abut portion provided on the second-group hand. In addition, the maximum pitch between a second-group hand located on an upper side and a first-group hand located immediately therebelow is defined by abutment between an upward abut portion provided on the second-group hand on the upper side and a downward abut portion provided on the first-group hand therebelow.

Preferably, sets of the upward abut portions of the first-group hands and downward abut portions of the second-group hands overlap with each other as viewed in the vertical direction at first planar positions, while sets of the upward abut portions of the second-group hands and downward abut portions of the first-group hands overlap with each other as viewed in the vertical direction at second planar positions spaced apart from the first planar positions.

Preferably, each of the hands is provided with a block that includes a lateral extension portion extending laterally from the hand, an upward extension portion extending upward from the lateral extension portion, and a folded extension portion extending from the upward extension portion toward the hand. The downward abut portions are formed on lower surfaces of the folded extension portions, and the upward abut portions are formed on upper surfaces of limit pieces that extend laterally from the hands. A minimum pitch of the hands is defined by the blocks abutting against each other in a vertically stacked manner at the first planar positions and the second planar positions.

Preferably, the support bodies of the hands have a rectangular virtual region, and the first planar positions and the second planar positions are located on opposing sides in a width direction of the rectangular virtual region.

Preferably, the guide is configured to guide the blocks at the first planar position and the blocks at the second planar positions.

Preferably, the multi-level hand apparatus further includes an elevating mechanism configured to raise and lower a topmost hand, i.e., the hand disposed at the top of the plurality of hands.

According to a second aspect of the present disclosure, there is provided a conveying robot incorporating a multi-level hand apparatus of the first aspect.

In the above-noted multi-level hand apparatus, the hand pitch limiter is configured such that the maximum pitch between the first-group hand located at the top (first hand) and the second-group hand immediately therebelow (second hand) is defined by abutment between the upward abut portion of the first hand at the top and the downward abut portion of the second hand immediately therebelow. Also, the maximum pitch between the second hand, which is in the second group, and the first-group hand that is immediately therebelow (third hand) is defined by abutment between the upward abut portion of the second hand and the downward abut portion of the third hand. In this way, in pairs of adjacent hands, the maximum interval between the hands is defined by abutment between the upward abut portion of the hand on the upper side and the downward abut portion of the hand on the lower side, and the hand pitch between all of the hands is set to the predetermined maximum pitch when the hand located at the top is raised a predetermined distance. As can be understood from the above, the hand pitch limiter can be entirely (or substantially entirely) configured within the planar area occupied by the hands. Accordingly the planar area taken by the multi-level hand apparatus does not increase even if the number of hands increases.

Further, since the hands are grouped into the first-group hands located at every other position and the remaining second-group hands, the sets of the upward abut portions of the first-group hands and downward abut portions of the second-group hands can be arranged at different planar positions from the sets of the upward abut portions of the second-group hands and downward abut portions of the first-group hands. Accordingly, the minimum hand pitch can be reduced, which enables collective conveying of a number of workpieces to and from cassettes of a smaller pitch.

Other features and advantages of the present disclosure will become apparent from the detailed description given below with reference to the drawings.

EMBODIMENTS

Embodiments of various aspects of the present disclosure will be described below in detail with reference to the drawings.

Figure 1:
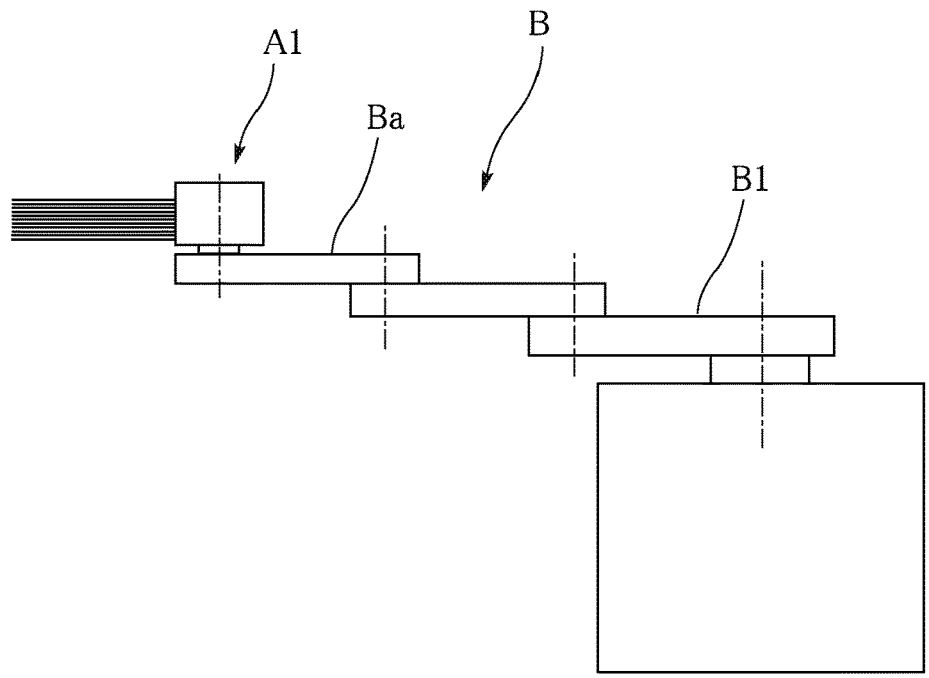
FIG. 1 is an overall configuration view of an example of a conveying robot that includes a multi-level hand apparatus according to the present disclosure.
Figure 2:
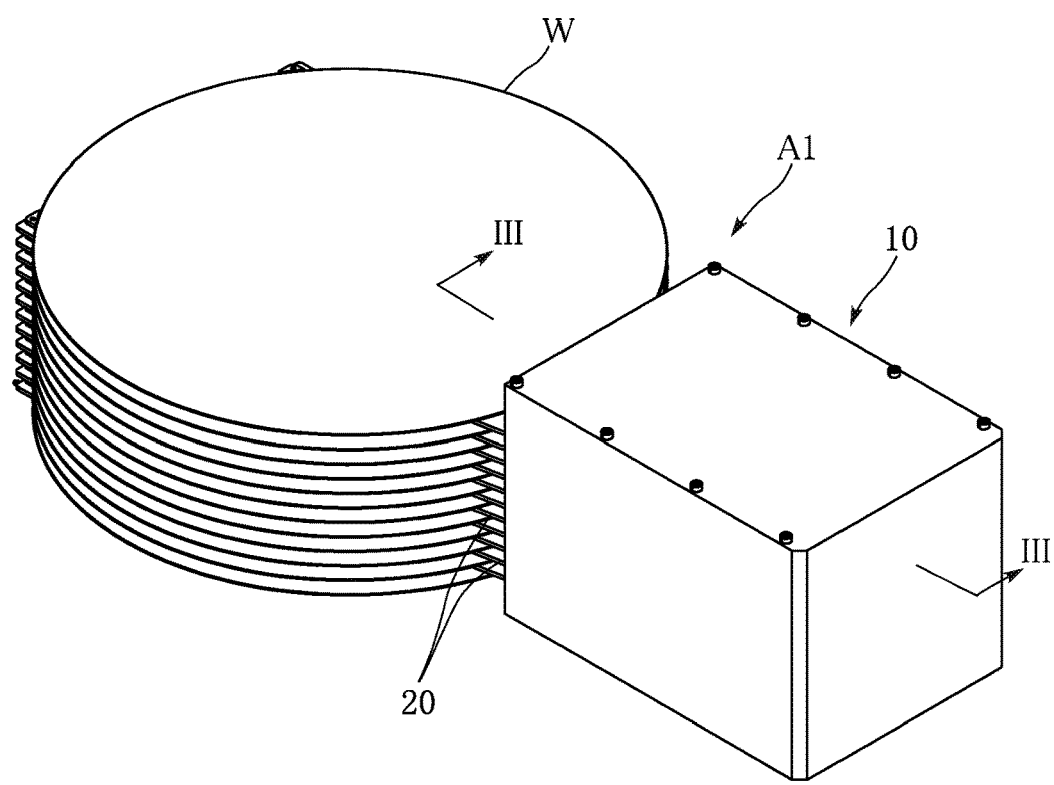
FIG. 2 is an overall perspective view of an example of the multi-level hand apparatus according to the present disclosure.

As shown in FIG. 1, according to an aspect of the present disclosure, a multi-level hand apparatus A1 is provided on an effector mount arm Ba of an articulated robot B1 or the like, thus constituting a conveying robot B. The conveying robot B may have any configuration as long as the leading end of the effector mount arm Ba can be moved three-dimensionally with a controlled orientated.

FIGS. 2 to 9 show the multi-level hand apparatus A1 according to a first embodiment. This multi-level hand apparatus A1 includes: an accommodation box 10; multiple hands 20 that are vertically spaced apart from each other (in other words, disposed so as to overlap with each other as viewed in a vertical direction); a guide 70 (FIGS. 4 and 9) that guides movement of the hands 20 in the vertical direction while maintaining the orientation of the hands 20; a hand pitch limiter 50 (FIG. 9) that limits or defines the maximum hand pitch of the hands 20; and an elevating mechanism 60 that raises/lowers the top hand (first hand 20a).

Figure 3:
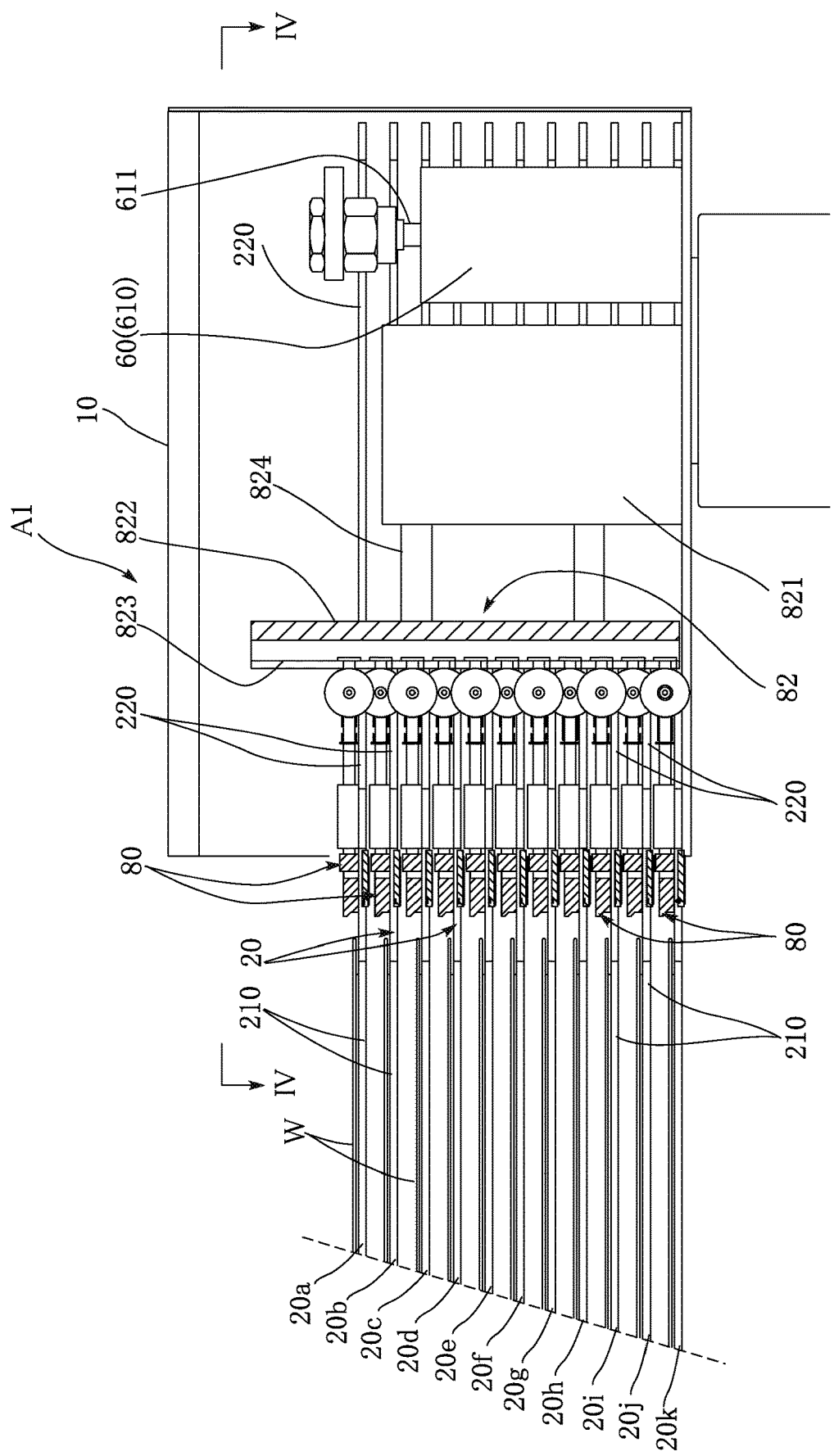
FIG. 3 is a cross-sectional view taken along line III-III in FIG. 2.
Figure 4:
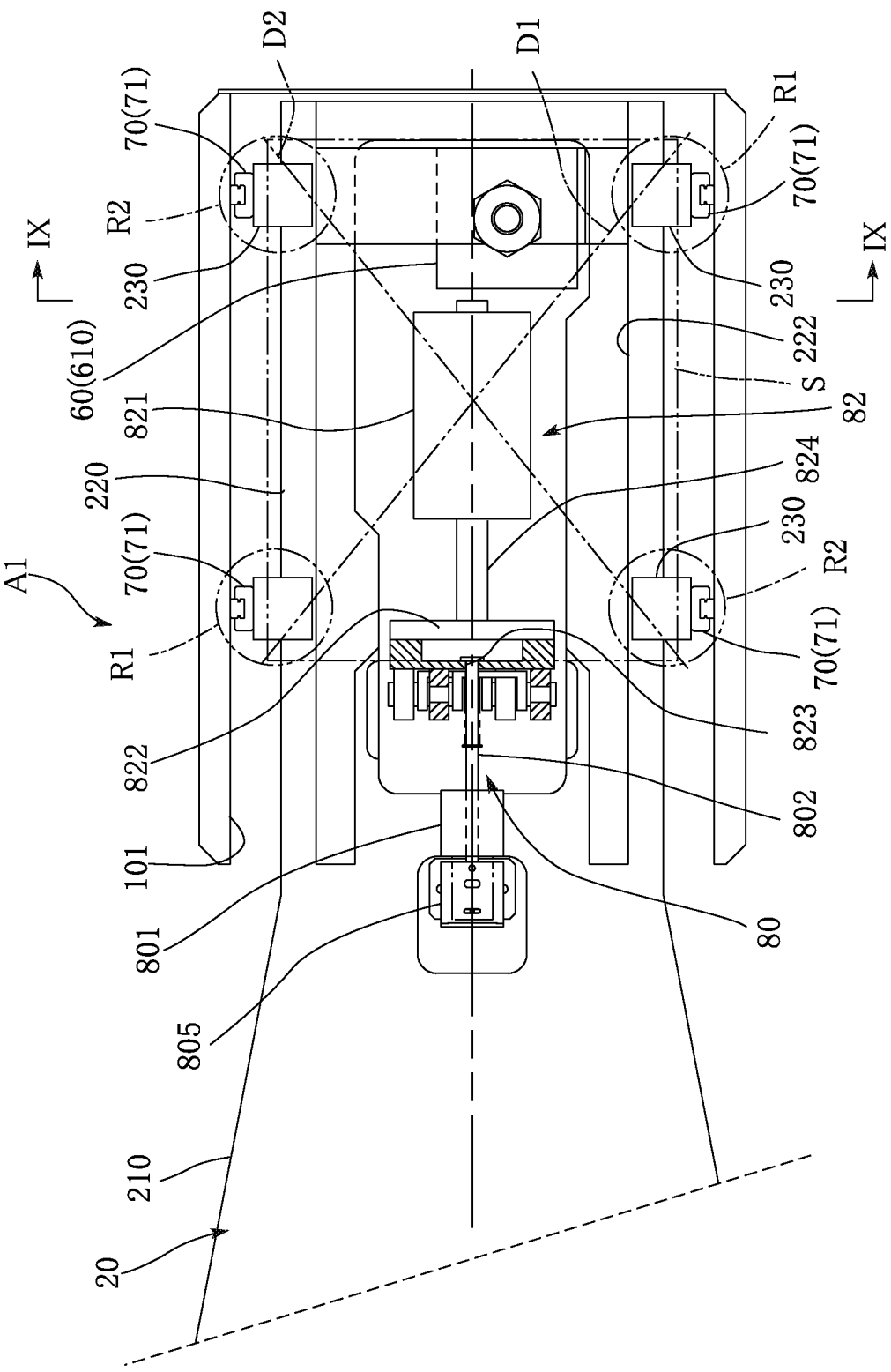
FIG. 4 is a cross-sectional view taken along line IV-IV in FIG. 3.

In the present embodiment, the hands 20 are each configured for the placement and conveying of a plate-shaped workpiece W, which is a circular silicon wafer for semiconductor manufacturing, and each include a two-pronged fork-like hand body 210 (FIG. 8) at the leading end side and a support body 220 that is coupled to the base portion of the hand body 210. The hand body 210 is mainly formed from a lightweight and hard material such as carbon fiber reinforced plastic, and the support body 220 is molded from metal, a hard resin, or the like. The hands 20 are vertically arranged one above another. Specifically, the guide 70 allows and guides free movement of the support bodies 220 of the hands 20 in the vertical direction inside the accommodation box 10 while maintaining the horizontal orientation of the support bodies 220, and the hand bodies 210 extend out from a front opening 101 of the accommodation box 10 (FIGS. 3 and 4). In the present embodiment, the support body 220 of the bottom hand (eleventh hand 20k) is fixed to a bottom portion of the accommodation box 10, and ten hands (first to tenth hands 20a to 20j from top to bottom), which are guided by the guide 70 as described above, are arranged over the bottom hand (FIGS. 3 and 9).

Each hand 20 is provided with a clamp mechanism 80 that moves in coordination with claws 211 (FIG. 8) provided on the hand body 210 to hold a workpiece W placed on the hand body 210, and a clamp driving mechanism 82 is provided in order to cause the clamp mechanisms 80 of the hands 20 to operate at the same time, but this will be described later.

Figure 13:
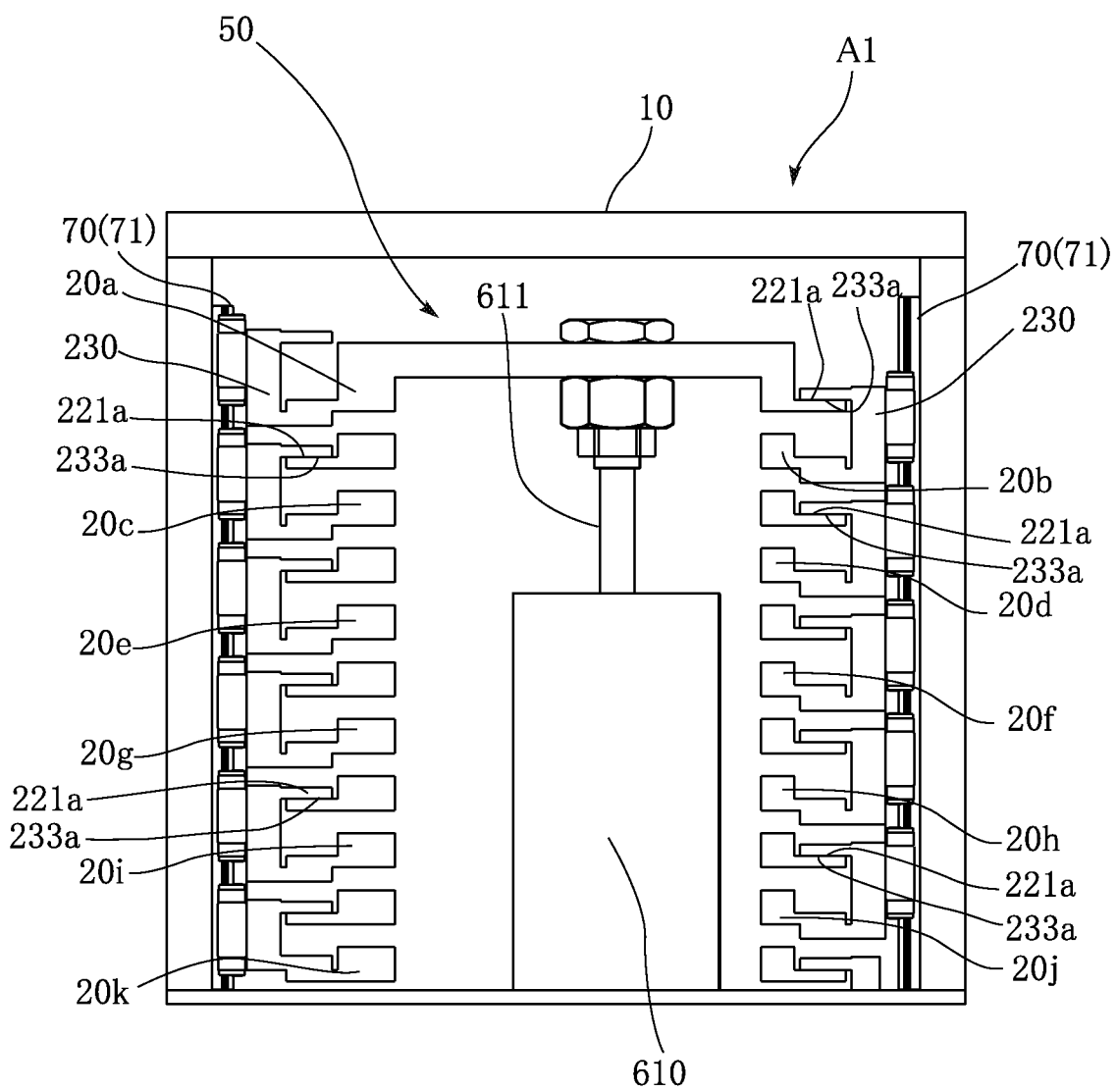
FIG. 13 is a diagram illustrating operations of the hand pitch limiter, and corresponds to the cross-sectional view taken along line IX-IX in FIG. 4.

As show in detail in FIGS. 9 to 13, the eleven hands 20a to 20k are divided into two groups, namely first-group hands including the top first hand 20a and the subsequent odd-numbered hands at every other position (first, third, fifth, seventh, and ninth hands 20a, 20c, 20e, 20g, 20i, and 20k), and second-group hands including the remaining even-numbered hands (second, fourth, sixth, eighth, and tenth hands 20b, 20d, 20f, 20h, and 20j), and the hand pitch limiter 50 is configured to limit or define the maximum pitch between the first-group hands 20a, 20c, 20e, 20g, 20i, and 20k that are located on the upper side and the second-group hands 20b, 20d, 20f, 20h, and 20j that are located directly below those first-group hands by abutment between upward abut portions 221a (FIG. 9) provided on the first-group hands 20a, 20c, 20e, 20g, 20i, and 20k and downward abut portions 233a (FIG. 9) provided on the second-group hands 20b, 20d, 20f, 20h, and 20j (FIG. 13), and to also limit the maximum pitch between the second-group hands 20b, 20d, 20f, 20h, and 20j that are located on the upper side and the first-group hands 20a, 20c, 20e, 20g, 20i, and 20k that are located directly below those second-group hands by abutment between upward abut portions 221*a* provided on the second-group hands 20*b*, 20*d*, 20*f*, 20*h*, and 20*j* and downward abut portions 233*a* provided on the first-group hands 20*a*, 20*c*, 20*e*, 20*g*, 20*i*, and 20*k* (FIG. 13).

In the present embodiment, the upward abut portions 221*a* are constituted by upper surfaces of limit pieces 221 that extend laterally from the support bodies 220 of the hands 20. Also, the hands 20 each have a substantially U-shaped block 230 (sharp-cornered "U") that includes a lateral extension portion 231 that extends laterally from the support body 220, an upward extension portion 232 that extends upward from the leading end of the lateral extension portion 231, and a folded extension portion 233 that extends from an upper portion of the upward extension portion 232 toward the support body 220 of the hand 20, and the downward abut portions 233*a* are constituted by lower surfaces of the folded extension portions 233.

Also, in the present embodiment, sets of the upward abut portions 221*a* of the first-group hands 20*a*, 20*c*, 20*e*, 20*g*, 20*i*, and 20*k* and the downward abut portions 233*a* of the second-group hands 20*b*, 20*d*, 20*f*, 20*h*, and 20*j* are arranged to be overlaid on each other (in other words, arranged to overlap with each other) in the vertical direction at first planar positions (hereinafter, these overlaid portions will be called first-set abutting relationship portions R1 (FIG. 4)), and sets of the upward abut portions 221*a* of the second-group hands 20*b*, 20*d*, 20*f*, 20*h*, and 20*j* and the downward abut portions 233*a* of the first-group hands 20*a*, 20*c*, 20*e*, 20*g*, 20*i*, and 20*k* are overlaid on each other in the vertical direction at second planar positions that are different from the first planar positions (hereinafter, these overlaid portions will be called second-set abutting relationship portions R2 (FIG. 4)). More specifically, as shown in FIG. 4, the support bodies 220 of the hands 20 have a substantially rectangular virtual region S in a plan view, the first-set abutting relationship portions R1 are provided at two locations on one diagonal line D1 of the substantially rectangular virtual region S, and the second-set abutting relationship portions R2 are provided at two locations on another diagonal line D2. In other words, one first-set abutting relationship portion R1 and one second-set abutting relationship portion R2 are arranged opposing each other in the width direction of the support body 220 of the hand 20 on both the front side and the rear side of the substantially rectangular virtual region S, and the left-right relationship between the first-set abutting relationship portion R1 and the second-set abutting relationship portion R2 in the front portion is opposite to that in the rear portion.

The guide 70 is configured by linear guides 71 that have tracks extending in the vertical direction, are provided at the first-set abutting relationship portions R1 (two locations) and the second-set abutting relationship portions R2 (two locations), and guide the blocks 230 that are overlaid in the vertical direction.

Also, the support bodies 220 of the hands 20 (excluding the first hand 20*a*) are each provided with a through-hole 222 that extends in the thickness direction, thus forming a space for arrangement of the elevating mechanism 60 and the clamp driving mechanism 82.

The elevating mechanism 60 is configured by an air cylinder 610 that is arranged extending upward on a bottom portion of the accommodation box 10, and a piston rod 611 whose leading end is coupled to the support body 220 of the first hand 20*a* located at the top. Besides an air cylinder, another linear actuator can be used in the elevating mechanism 60.

The hands 20 are each provided with the clamp mechanism 80 that moves in coordination with the claws 211 provided on the hand body 210 to hold a workpiece W placed on the hand body 210. The clamp mechanisms 80 are configured to perform clamp holding and clamp releasing all at once even if the pitch between the hands 20 is changed. Furthermore, the clamp mechanisms 80 are each provided with a clamp sensor 83 (FIGS. 6 and 7) that detects unsuitable holding of a workpiece W. The aforementioned aspects will be described in order below.

The clamp mechanisms 80 are each configured by a holder 801 arranged on the support body 220 of the hand 20, a rod 802 held by the holder 801 so as to be capable of moving in the axial direction but not rotating in the axial direction, and a clamp body 805 attached to the leading end of the rod 802, and the rods 802 move forward and rearward all at once.

Figure 5:
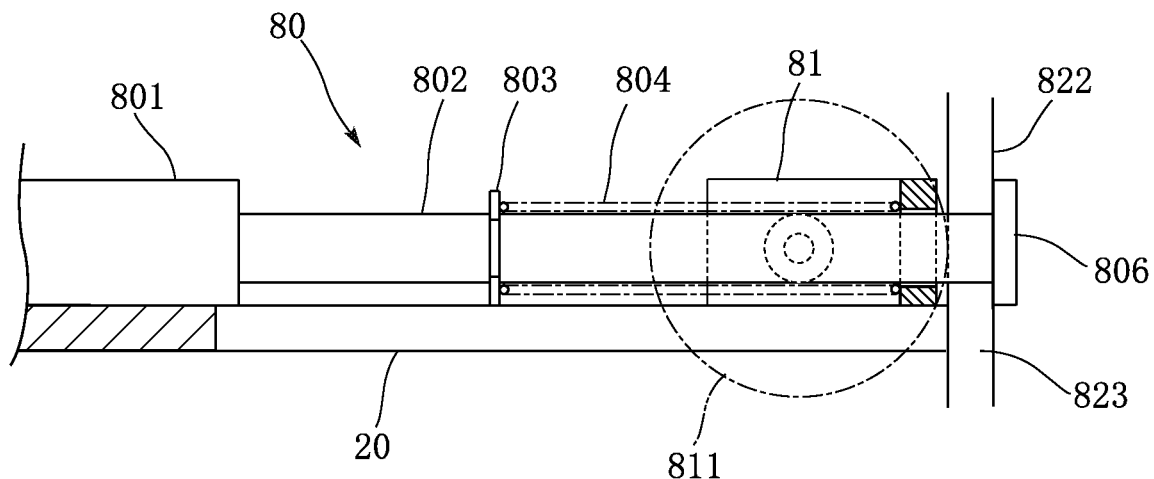
FIG. 5 is a diagram illustrating a rear portion of a clamp mechanism.
Figure 6:
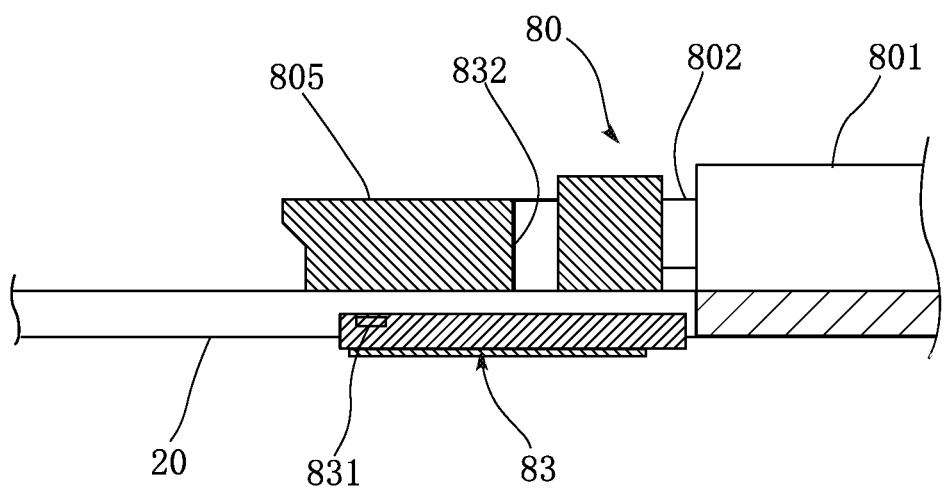
FIG. 6 is a diagram illustrating a front portion of the clamp mechanism.
Figure 7:
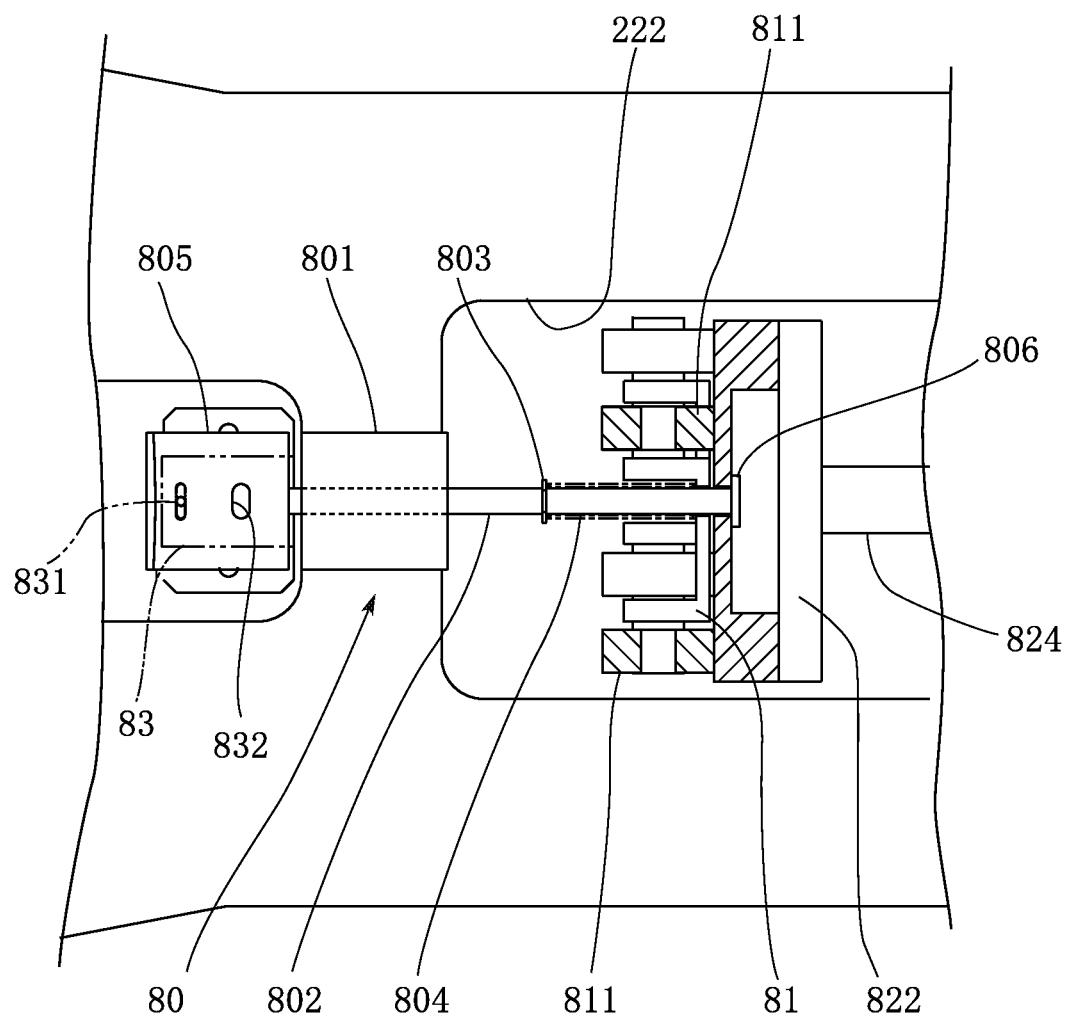
FIG. 7 is a plan view of the clamp mechanism.
Figure 8:
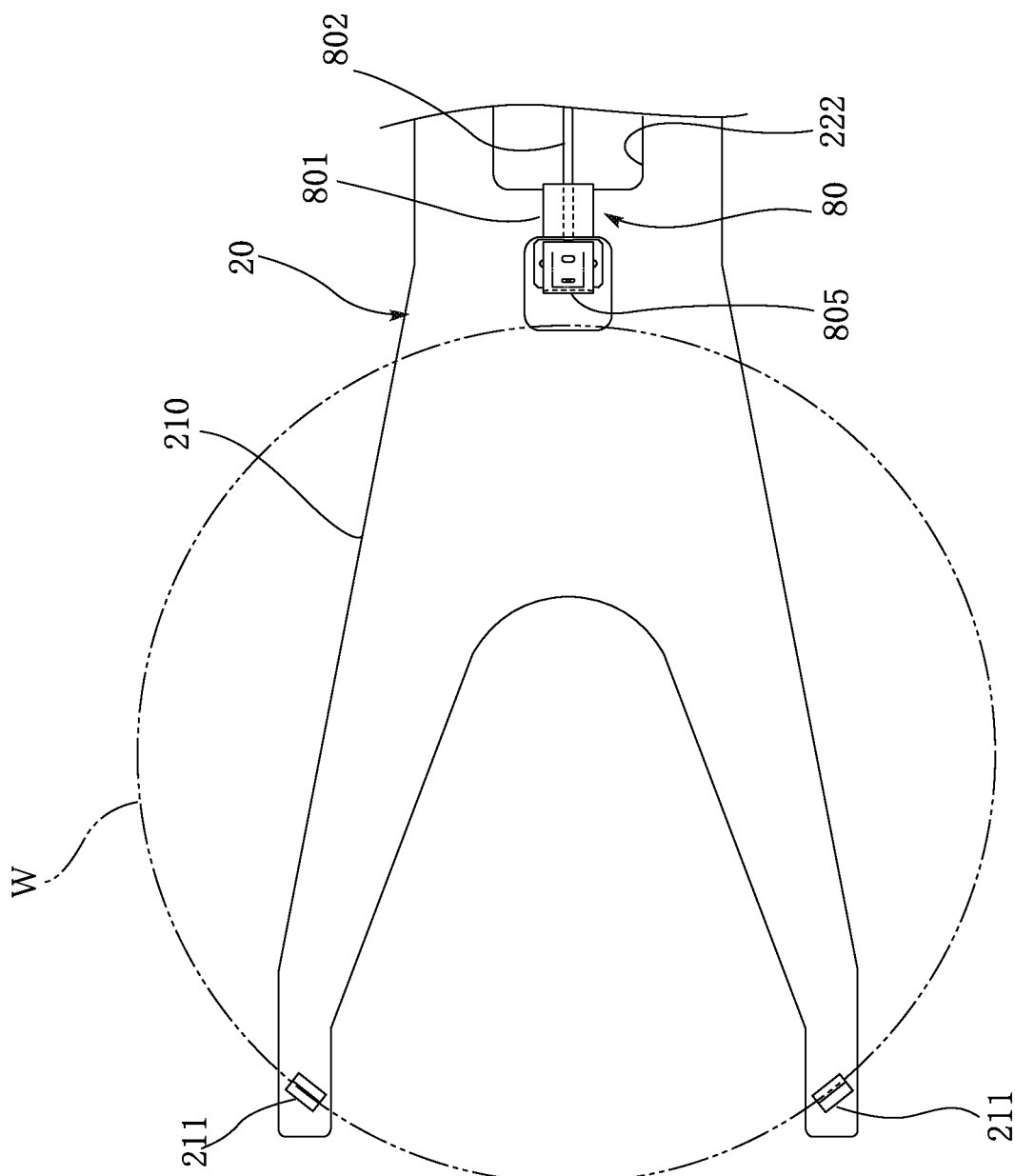
FIG. 8 is a plan view of a front portion (hand body) of a hand.

As shown in FIGS. 4 to 6, a flange 803 is provided on the rod 802, a spring receiving member 81 is arranged rearward of the flange 803 and can slide in the axial direction relative to the rod 802 but cannot rotate about the axis of the rod 802, and the rod 802 is constantly biased in the forward direction by a compression coil spring 804 that extends between the flange 803 and the spring receiving member 81. A portion of the rod 802 that is rearward of the spring receiving member 81 is inserted through a slit 823 that is formed extending in the vertical direction in a head member 822 that is elongated in the vertical direction and is moved forward and rearward by a horizontal air cylinder 821 that serves as the later-described clamp driving mechanism 82. A flange 806 that cannot pass through the slit 823 is formed at the rear end of the rod 802. The spring receiving member 81 is provided with a pair of rollers 811 that are respectively arranged on the left and right sides with respect to the axial direction of the rod 802, and are in contact with and can roll on the front surface of the head member 822. In order to prevent interference between the rollers 811 of hands 20 that are adjacent in the vertical direction, the rollers 811 provided in the second-group hands 20*b*, 20*d*, 20*f*, 20*h*, and 20*j* are displaced in the left-right direction from the rollers 811 provided in the first-group hands 20*a*, 20*c*, 20*e*, 20*g*, 20*i*, and 20*k*.

The clamp sensors 83 are each configured by a limited reflection-type sensor 831 provided on the hand body 210, and a through-hole 832 that passes through the clamp body 805 in the vertical direction. If a workpiece W is held suitably, light passes through the through-hole 832, reflected light is not detected, and the limited reflection-type sensor 831 is in the off state, whereas if a workpiece W is not held suitably, light is reflected by the lower surface of the clamp body 805, the reflected light is detected, and the limited reflection-type sensor 831 enters the on state.

The following describes operations of the multi-level hand apparatus A1 having the above-described configuration.

Figure 9:
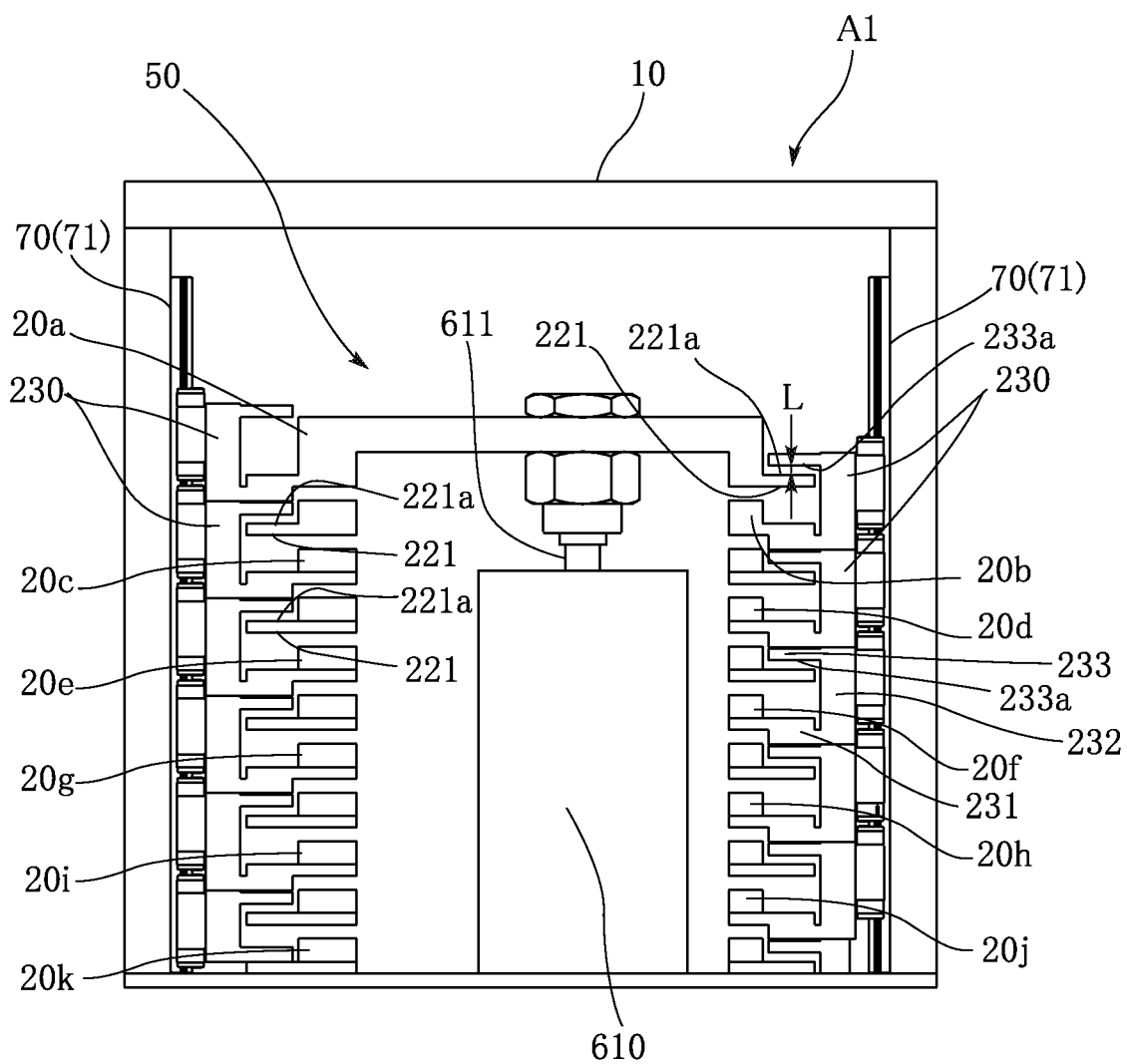
FIG. 9 is a cross-sectional view taken along line IX-IX in FIG. 4.

First, operations pertaining to changing the hand pitch of the hands 20 will be described. FIG. 9 shows a cross-section taken along line IX-IX in FIG. 4, and shows the state where the hand pitch is the minimum pitch. The piston rod 611 of the elevating mechanism 60 is at the lowest position. In this state, the blocks 230 of the first-group hands 20*a*, 20*c*, 20*e*, 20*g*, 20*i*, and 20*k* in the first-set abutting relationship portions R1 (FIG. 4) and the blocks 230 of the second-group hands 20*b*, 20*d*, 20*f*, 20*h*, and 20*j* in the second-set abutting relationship portions R2 are stacked on each other in the vertical direction. The minimum pitch of the hands 20 is defined by this vertical stacking of the blocks 230. Note that in this state, the upward abut portion 221a of a hand 20 on the upper side and the downward abut portion 233a of the hand 20 immediately therebelow are separated and do not abut against each other. At this time, the hand pitch is considered to be 7.0 mm, for example. According to this configuration, there is no need for a separate configuration for limiting the hand pitch to a minimum pitch.

Figure 10:
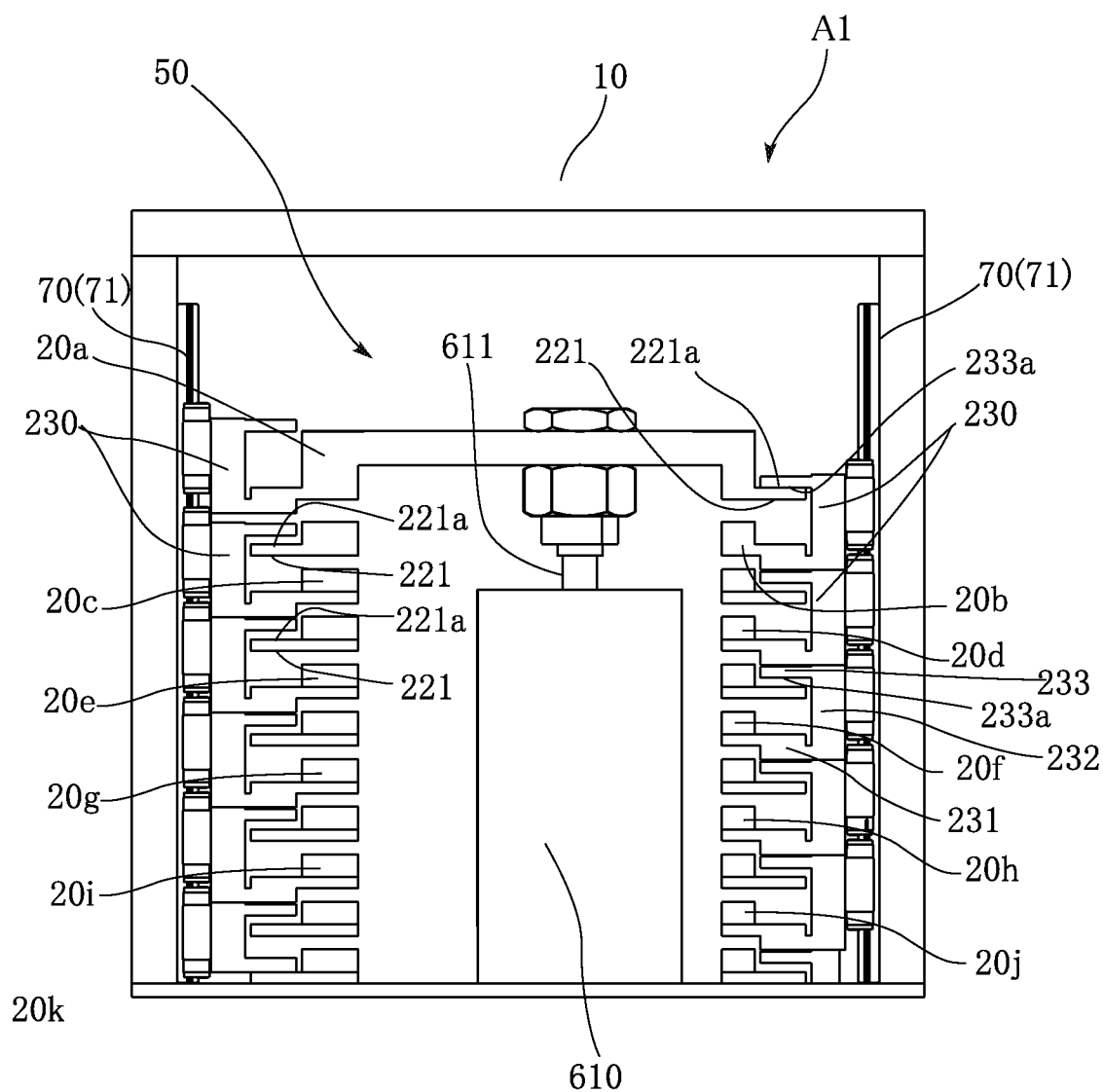
FIG. 10 is a diagram illustrating operations of a hand pitch limiter, and corresponds to the cross-sectional view taken along line IX-IX in FIG. 4.
Figure 11:
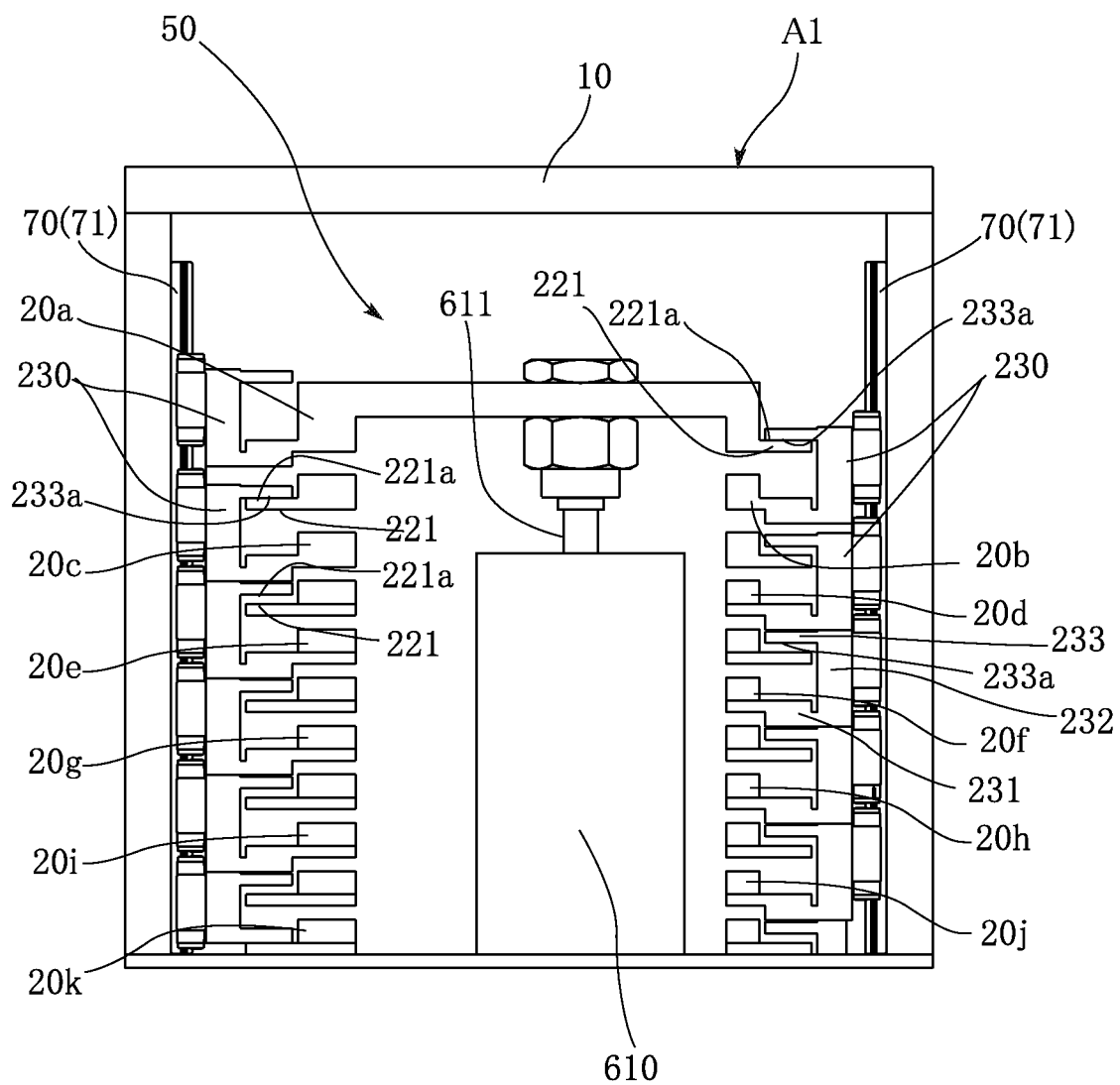
FIG. 11 is a diagram illustrating operations of the hand pitch limiter, and corresponds to the cross-sectional view taken along line IX-IX in FIG. 4.
Figure 12:
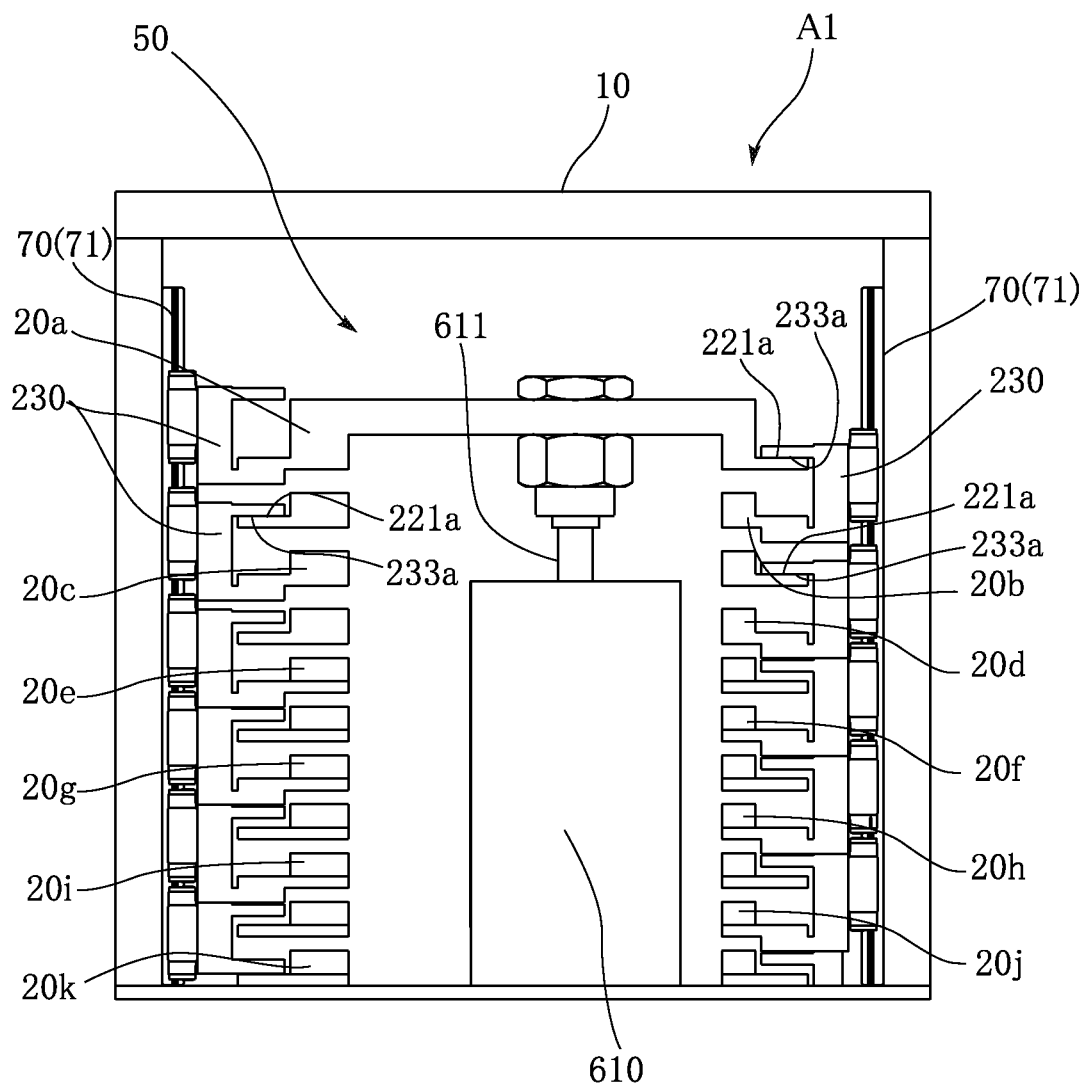
FIG. 12 is a diagram illustrating operations of the hand pitch limiter, and corresponds to the cross-sectional view taken along line IX-IX in FIG. 4.

When the piston rod 611 of the elevating mechanism 60 starts to rise from the state shown in FIG. 9, first, in the first-set abutting relationship portions R1, the upward abut portion 221a of the first hand 20a located at the top comes into contact with the downward abut portion 233a of the second hand 20b, and then the second hand 20b rises along with the first hand 20a (FIG. 10). Next, in the second-set abutting relationship portions R2, the upward abut portion 221a of the second hand 20b comes into contact with the downward abut portion 233a of the third hand 20c, and then the third hand 20c rises along with the first hand 20a and the second hand 20b (FIG. 11). Thereafter, similarly, the upward abut portion 221a of a hand 20 on the upper side comes into contact with the downward abut portion 233a of the hand 20 therebelow and lifts up that hand 20, and then ultimately, as shown in FIG. 13, the upward abut portions 221a of all of the hands 20 on the upper side abut against the downward abut portions 233a of the hands 20 therebelow. In the state shown in FIG. 13, the piston rod 611 of the elevating mechanism 60 can no longer rise any further. In the state shown in FIG. 9, the upward abut portions 221a of the hands 20 on the upper side and the downward abut portions 233a of the hands 20 immediately therebelow do not abut against each other and are separated by a predetermined distance L, and in the state shown in FIG. 13 in which the upward abut portions 221a of all of the hands 20 on the upper side abut against the downward abut portions 233a of the hands 20 immediately therebelow, the hand pitch has increased from the state shown in FIG. 9 by an amount equal to the distance L. At this time, the hand pitch is considered to be 10.0 mm, for example.

In this way, by raising/lowering the piston rod 611 of the elevating mechanism 60, the hand pitch of the multi-level hand apparatus A1 of the present embodiment can be changed to either of two levels, namely the maximum pitch and the minimum pitch. As understood from the above description, the configuration for changing the hand pitch of the multi-level hand apparatus A1 of the present embodiment can be almost entirely configured particularly in the planar area occupied by the support bodies 220 of the hands 20, and therefore the planar area occupied by the multi-level hand apparatus A1 does not increase even if the number of hands 20 increases.

Moreover, the hands 20 are grouped into the first-group hands 20a, 20c, 20e, 20g, 20i, and 20k at every other position and the remaining second-group hands 20b, 20d, 20f, 20h, and 20j, and therefore sets of the upward abut portions 221a of the first-group hands 20a, 20c, 20e, 20g, 20i, and 20k and the downward abut portions 233a of the second-group hands 20b, 20d, 20f, 20h, and 20j (first-set abutting relationship portions R1) can be arranged at different planar positions from sets of the upward abut portions 221a of the second-group hands 20b, 20d, 20f, 20h, and 20j and the downward abut portions 233a of the first-group hands 20a, 20c, 20e, 20g, 20i, and 20k (second-set abutting relationship portions R2). Accordingly, it is possible to reduce the minimum hand pitch and collectively convey a group of workpieces to and from cassettes that have a smaller pitch.

Also, the first-set abutting relationship portions R1 and the second-set abutting relationship portions R2 are arranged opposing each other in the width direction of the support bodies 220 of the hands 20, and therefore the hands can be raised/lowered while maintaining the balance thereof.

Next, operations of the clamp mechanisms 80 will be described.

Due to extension of a piston rod 824 of the air cylinder 821, which serves as the clamp driving mechanism 82, the clamp bodies 805 of the hands 20 move forward all at once and move in cooperation with the claws 211 of the hand bodies 210 so as to hold and prevent the falling of the workpieces W placed on the hand bodies 210. Conversely, due to retraction of the piston rod 824, the clamp bodies 805 of the hands 20 move rearward all at once, thus making it possible to release the holding of the workpieces W. Note that besides an air cylinder, any type of linear driven actuator can be used as the clamp movement mechanism 82.

Figure 14:
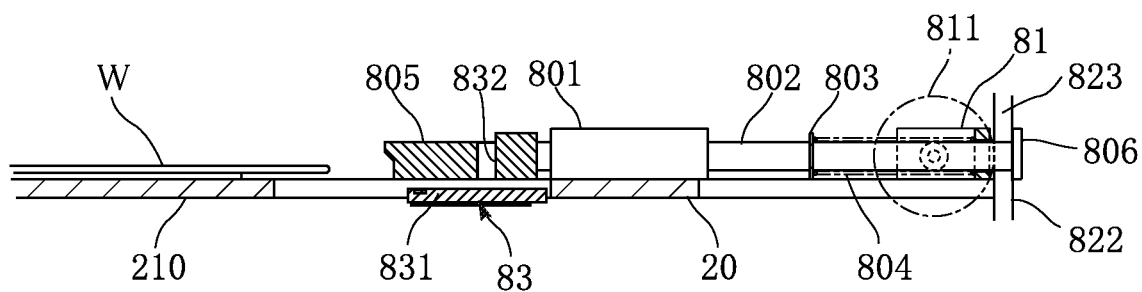
FIG. 14 is a diagram illustrating operations of the clamp mechanism and a clamp sensor.
Figure 15:
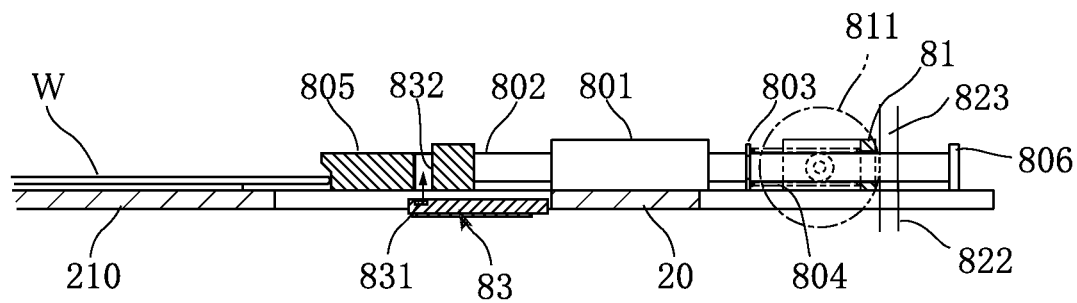
FIG. 15 is a diagram illustrating operations of the clamp mechanism and the clamp sensor.
Figure 16:
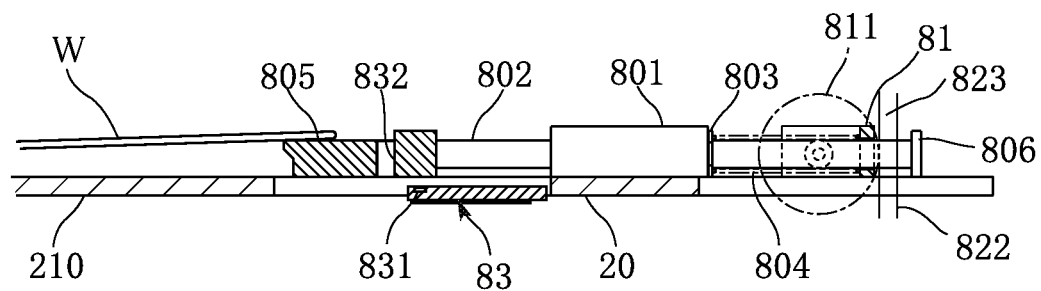
FIG. 16 is a diagram illustrating operations of the clamp mechanism and the clamp sensor.

As shown in FIGS. 14 to 16, when workpieces W are to be held by the clamp mechanisms 80 of the hands 20, the rods 802 receive forward drive force from the clamp driving mechanism 82 via the head member 822 attached to the leading end of the piston rod 824. More specifically, the spring receiving members 81 are pushed forward via the rollers 811 that are in contact with the front surface of the head member 822, and the rods 802 receive forward elastic movement force via the compression coil springs 804 that are arranged between the spring receiving members 81 and the flanges 803 (FIG. 14). After the workpieces W have entered the state of being held between the clamp bodies 805 and the claws 211, even if the head member 822 moves farther forward, the rods 802 and the clamp bodies 805 do not move forward any further, and the compression coil springs 804 becomes compressed (FIG. 15). In this way, the workpieces W are held by elastic pressing force applied by the clamp bodies 805, and therefore will not become damaged if subjected to impact while being held by the clamp bodies 805.

Note that while the workpieces W are held by the clamp mechanisms 82 in this way, that is to say while the clamp bodies 805 are in the forward state, if a workpiece W is not being held suitably, the compression coil spring 804 pushes the clamp body 805 forward beyond the suitable position for holding the workpiece W along with the claws 211 (FIG. 16). This unstable position of the clamp body 805 is detected when the limited reflection-type sensor 831, which serves as the clamp sensor 83, turns on. Due to this unsuitable position detection signal regarding the clamp body 805, it is possible to, for example, immediately stop the conveying robot B in order to avoid a problem that may occur thereafter.

In order to release the workpieces W from the clamp bodies 805, the head member 822 moves rearward and pushes the flanges 806 at the rear ends of the rods 802 rearward such that the rods 802 and the clamp bodies 805 move rearward and the workpieces W are released.

The rods 802 in the clamp mechanisms 82 of the hands 20 pass through the slit 823 of the head member 822, and the rollers 811 of the spring receiving members 81 are in contact with and can roll on the front surface of the head member 822, and therefore the rods 802 can move in the vertical direction relative to the head member 822 with almost no resistance. Accordingly, while workpieces W are clamped by the hands 20, it is possible to prevent a problem such as excessive force being applied to the elevating mechanism 60 and the hands 20 in the vertical direction when the hand pitch of the hands 20 is changed from the maximum state to the minimum state, and when the hand pitch is changed from the minimum state to the maximum state. Also, regardless of whether the hand pitch is in the maximum state or the minimum state, the clamp mechanisms 82 of the hands 20 can operate all at once in order to hold workpieces W or release them.

Of course the scope of the present disclosure is not intended to be limited to the embodiment described above, and various changes within the range of the matter described in the claims are all encompassed in the scope of the present disclosure.

Figure 17:
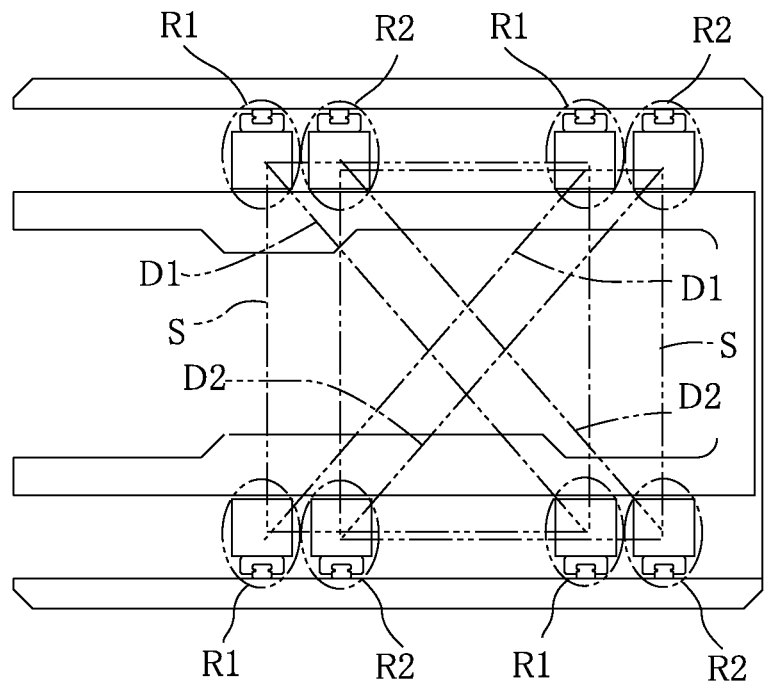
FIG. 17 is a schematic view illustrating a variation of the multi-level hand apparatus according to the present disclosure.
Figure 18:
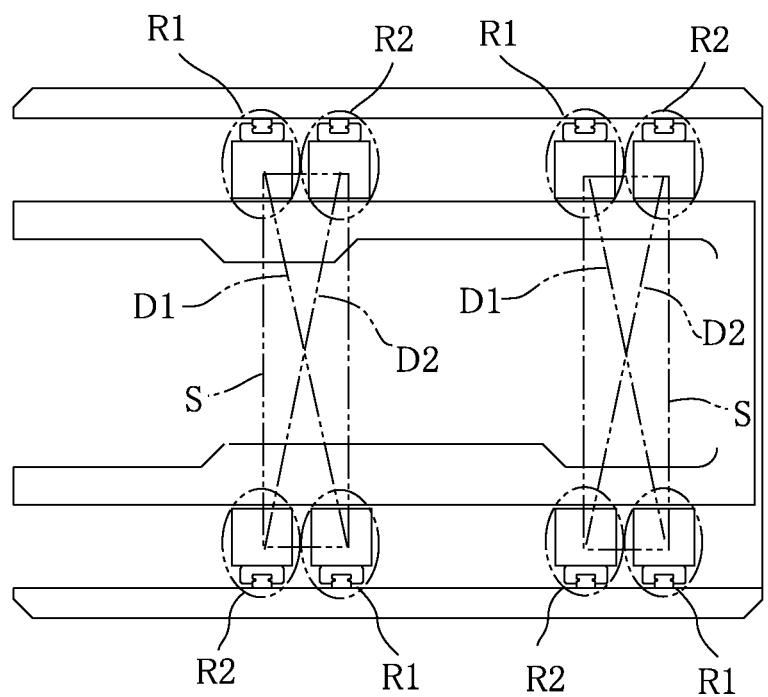
FIG. 18 is a schematic view illustrating a variation of the multi-level hand apparatus according to the present disclosure.

For example, various planar arrangements of the first-set abutting relationship portions R1 and the second-set abutting relationship portions R2 other than that shown in the example in FIG. 4 are conceivable as shown in FIGS. 17 and 18.

In the example shown in FIG. 4, one substantially rectangular virtual region S is envisioned, and the first-set abutting relationship portions R1 and the second-set abutting relationship portions R2 are respectively arranged on the diagonal lines D1 and D2. However, if the hands 20 have an increased weight or are made of a flexible material, there are cases where the hands 20 need to be smoothly elevated while maintaining the rigidity thereof when the elevating mechanism 60 is operated, for example, and in such a case, as shown in FIGS. 17 and 18, a configuration is possible in which two or more substantially rectangular virtual regions S are set, the number of first-set abutting relationship portions R1 and second-set abutting relationship portions R2 is appropriately increased, and the first-set abutting relationship portions R1 and the second-set abutting relationship portions R2 are respectively arranged on diagonal lines D1 and D2 in a relationship similar to that illustrated in FIG. 4 for each of the substantially rectangular virtual regions S.

The invention claimed is:

1. A multi-level hand apparatus comprising:
   a plurality of hands arranged to overlap with each other as viewed in a vertical direction and each having a hand body and a support body that supports the hand body at a base portion of the hand body;
   a guide for allowing and guiding movement of the hands in the vertical direction while maintaining orientations of the hands; and
   a hand pitch limiter for defining a maximum pitch of the hands,
   wherein the hands include first-group hands located at every other position and second-group hands other than the first-group hands, and
   the hand pitch limiter defines the maximum pitch between pairs of a first-group hand and a second-group hand that are vertically adjacent to each other;
   wherein the maximum pitch between a first-group hand located on an upper side and a second-group hand located immediately therebelow is defined by abutment between an upward abut portion provided on said first-group hand and a downward abut portion provided on said second-group hand, and
   the maximum pitch between a second-group hand located on an upper side and a first-group hand located immediately therebelow is defined by abutment between an upward abut portion provided on said second-group hand on the upper side and a downward abut portion provided on said first-group hand therebelow.

2. The multi-level hand apparatus according to claim 1, wherein sets of the upward abut portions of the first-group hands and the downward abut portions of the second-group hands overlap with each other as viewed in the vertical direction at first planar positions, and
   sets of the upward abut portions of the second-group hands and the downward abut portions of the first-group hands overlap with each other as viewed in the vertical direction at second planar positions spaced apart from the first planar positions.

3. The multi-level hand apparatus according to claim 2, wherein each of the hands comprises a block that includes a lateral extension portion extending laterally from said each hand, an upward extension portion extending upward from the lateral extension portion, and a folded extension portion extending from the upward extension portion toward said each hand,
   the downward abut portions are formed on lower surfaces of the folded extension portions, and the upward abut portions are formed on upper surfaces of limit pieces that extend laterally from the hands, and
   a minimum pitch of the hands is defined by the blocks abutting against each other in a vertically stacked manner at the first planar positions and the second planar positions.

4. The multi-level hand apparatus according to claim 3, wherein the support bodies of the hands have a rectangular virtual region, and the first planar positions and the second planar positions are located on opposing sides in a width direction of the rectangular virtual region.

5. The multi-level hand apparatus according to claim 3, wherein the guide is configured to guide the blocks at the first planar position and the blocks at the second planar positions.

6. A conveying robot comprising a multi-level hand apparatus according to claim 1.

7. A multi-level hand apparatus comprising:
   a plurality of hands arranged to overlap with each other as viewed in a vertical direction and each having a hand body and a support body that supports the hand body at a base portion of the hand body;
   a guide for allowing and guiding movement of the hands in the vertical direction while maintaining orientations of the hands;
   a hand pitch limiter for defining a maximum pitch of the hands,
   wherein the hands include first-group hands located at every other position and second-group hands other than the first-group hands,
   the hand pitch limiter defines the maximum pitch between pairs of a first-group hand and a second-group hand that are vertically adjacent to each other; and
   an elevating mechanism connected to an uppermost one of the hands.

\* \* \* \* \*